US012812952B2

(12) United States Patent
Strittmatter et al.

(10) Patent No.: US 12,812,952 B2
(45) **Date of Patent: *Nov. 24, 2026**

(54) GaN DEVICE WITH HOLE ELIMINATION CENTERS

(71) Applicant: Efficient Power Conversion Corporation, El Segundo, CA (US)

(72) Inventors: Robert Strittmatter, Tujunga, CA (US); Jianjun Cao, Torrance, CA (US); Robert Beach, La Crescenta, CA (US); Muskan Sharma, Lakewood, CA (US); Wen-Chia Liao, Torrance, CA (US); Alexander Lidow, Topanga, CA (US); Massimo Grasso, Trivolzio (IT); Sergio Morini, Pavia (IT)

(73) Assignee: Efficient Power Conversion Corporation, El Segundo, CA (US)

( * ) Notice: Subject to any disclaimer, the term of this patent is extended or adjusted under 35 U.S.C. 154(b) by 365 days.

This patent is subject to a terminal disclaimer.

(21) Appl. No.: 18/436,352

(22) Filed: Feb. 8, 2024

(65) Prior Publication Data

US 2024/0274681 A1 Aug. 15, 2024

Related U.S. Application Data

(60) Provisional application No. 63/504,084, filed on May 24, 2023, provisional application No. 63/483,997, filed on Feb. 9, 2023.

(51) Int. Cl.

*H10D 64/27* (2025.01)
*H02M 3/07* (2006.01)

(Continued)

(52) U.S. Cl.

CPC ............ *H10D 64/411* (2025.01); *H02M 3/07* (2013.01); *H10D 30/475* (2025.01); *H10D 62/8503* (2025.01)

(58) Field of Classification Search

CPC .. H10D 30/471; H10D 30/475; H10D 30/472; H10D 64/27

See application file for complete search history.

(56) References Cited

U.S. PATENT DOCUMENTS 8,350,294 B2 1/2013 Lidow et al.
8,890,168 B2 11/2014 Lidow et al.

(Continued)

FOREIGN PATENT DOCUMENTS

TW 202504109 A 1/2025

OTHER PUBLICATIONS

I. Hwang et al., "Source-Connected p-GaN Gate HEMTs for Increased Threshold Voltage", IEEE Electron Device Letters, vol. 34, No. 5, May 2013, pp. 605-607.

(Continued)

*Primary Examiner* — Davienne N Monbleau
*Assistant Examiner* — Emily Farmer
(74) *Attorney, Agent, or Firm* — Blank Rome LLP

(57) ABSTRACT

An enhancement mode gallium nitride (GaN) transistor with a p-type gate configured to eliminate holes accumulating under the gate metal. The gate has two electrodes, a gate electrode and a hole collector electrode. In a preferred embodiment, a negative voltage is applied to the hole collector electrode, attracting holes accumulating under the gate metal. The attracted holes recombine with electrons supplied by the negative voltage, thereby substantially eliminating the holes.

9 Claims, 11 Drawing Sheets

(51) Int. Cl.
*H10D 30/47* (2025.01)
*H10D 62/85* (2025.01)

(56) References Cited

U.S. PATENT DOCUMENTS

| | | | | |
|---|---|---|---|---|
| 9,634,100 | B2 | 4/2017 | Mishra et al. | |
| 10,622,455 | B2 | 4/2020 | Cao et al. | |
| 2010/0258848 | A1 | 10/2010 | Lidow et al. | |
| 2010/0320505 | A1* | 12/2010 | Okamoto | H10D 30/4755 438/168 |
| 2014/0015066 | A1* | 1/2014 | Wu | H10D 62/8503 257/E27.061 |
| 2014/0084339 | A1* | 3/2014 | Nishimori | H10D 62/81 438/478 |
| 2017/0200817 | A1 | 7/2017 | Curatola et al. | |
| 2018/0366559 | A1 | 12/2018 | Cao et al. | |
| 2019/0246051 | A1* | 8/2019 | Mandelli | H04N 25/57 |
| 2020/0052687 | A1* | 2/2020 | Ming | H03K 17/063 |
| 2022/0102344 | A1 | 3/2022 | Then et al. | |
| 2022/0199795 | A1 | 6/2022 | Huang et al. | |
| 2025/0022932 | A1 | 1/2025 | Hsu et al. | |

OTHER PUBLICATIONS

Giorgino et al., "Study of Magnesium Activation Effect on Pinch-Off Voltage of Normally-Off p-GaN HEMTs for Power Applications," Crystals 2023, vol. 13, No. 3, 1309.

* cited by examiner

GaN DEVICE WITH HOLE ELIMINATION CENTERS

CROSS-REFERENCE TO RELATED APPLICATIONS

This application claims the benefit of U.S. Provisional Application Nos. 63/483,997, filed Feb. 9, 2023 and U.S. Provisional Application No. 63/504,084, filed May 24, 2023, the disclosures of which are incorporated by reference herein in their entireties.

BACKGROUND OF THE INVENTION

1. Field of the Invention

The present invention relates to the field of column III nitride transistors such as gallium nitride (GaN) transistors.

2. Description of the Related Art

Gallium nitride (GaN) semiconductor devices are increasingly desirable for power semiconductor devices because of their ability to carry large current and support high voltages. Development of these devices has generally been aimed at high power/high frequency applications. Devices fabricated for these types of applications are based on general device structures that exhibit high electron mobility and are referred to variously as heterojunction field effect transistors (HFET), high electron mobility transistors (HEMT), or modulation doped field effect transistors (MODFET).

A GaN HEMT device includes a nitride semiconductor with at least two nitride layers. Varied materials formed on the semiconductor or on a buffer layer cause the layers to have different band gaps. The different material in the adjacent nitride layers also causes polarization, which contributes to a conductive two-dimensional electron gas (2 DEG) region near the junction of the two layers, specifically in the layer with the narrower band gap.

The nitride layers that cause polarization typically include a barrier layer of AlGaN adjacent to a layer of GaN to include the 2 DEG, which allows charge to flow through the device. This barrier layer may be doped or undoped. Because the 2 DEG region exists under the gate at zero gate bias, nitride devices are inherently normally on, or depletion mode devices. If the 2 DEG region is depleted, i.e. removed, below the gate at zero applied gate bias, the device is an enhancement mode device. Enhancement mode devices are normally off and are desirable because of the added safety they provide and because they are easier to control with simple, low-cost drive circuits. An enhancement mode device requires a positive bias applied at the gate in order to conduct current.

FIG. 1 illustrates a cross-sectional view of an enhancement mode GaN transistor disclosed and claimed in U.S. Pat. No. 8,890,168, the disclosure of which is incorporated by reference. The GaN device of FIGS. 1A and 1B includes a silicon substrate 10, transition layers 12, undoped GaN buffer material 13, undoped AlGaN barrier layer 14, p-type GaN gate material 15, gate metal 17, dielectric material 18, drain ohmic contact 19, and source ohmic contact 20.

Like all enhancement mode GaN transistors, the GaN device of FIG. 1 conducts current from drain 19 to source 20 when the drain is biased positive with respect to the source, and a positive voltage is applied to the gate. However, as indicated in FIG. 1, under a high voltage drain bias, holes generated in the drain region (or other regions of the device where high electric fields exist) drift toward the gate and become trapped or confined within the p-type GaN gate layer. Hole generation may also occur in the gate region itself. The accumulation of these holes under the gate metal, over time, disadvantageously causes lower threshold voltage and higher drain-to-source leakage current when the device is off. It would be desirable to provide an enhancement mode GaN transistor in which these holes which accumulate under the gate metal are removed.

SUMMARY OF THE INVENTION

The present invention advantageously provides an enhancement mode GaN transistor with a feature that attracts holes accumulating under the gate metal, and continuously removes them from the gate region. The holes are removed from the gate region by any of several transport processes, including but not limited to: (1) recombination of the holes with electrons, thereby neutralizing the holes; (2) thermionic emission of holes over a Schottky metal contact, preferably with the contact biased at a negative voltage to enhance emission; and (3) tunneling or injection of holes across an ohmic contact. Using any of the above, holes are removed from the gate region, such that the device is capable of withstanding higher voltage.

The gate is formed of a p-type GaN material and has two electrodes: a gate electrode and a hole collector electrode. The hole collector electrode may make either a Schottky or an ohmic contact to the underlying p-type GaN material. The hole collector electrode is disposed at the top surface of the p-type GaN gate material and can extend into or through the p-type GaN gate material. The p-type GaN material under the hole collector electrode may be thinner than the p-type GaN material under the gate electrode. In a preferred embodiment of the invention, a negative voltage is applied to the hole collector electrode, such that holes accumulating under the gate are attracted and recombine with electrons supplied by the negative voltage connected to the hole collector electrode, thereby substantially eliminating the holes accumulating under the gate.

The negative voltage supplied to the hole collector electrode can be generated by a negative voltage generating circuit implemented in GaN and integrated with the enhancement mode GaN transistor.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

In the following detailed description, reference is made to certain embodiments. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings. It is to be understood that other embodiments may be employed and that various structural, logical, and electrical changes may be made.

Figure 1:
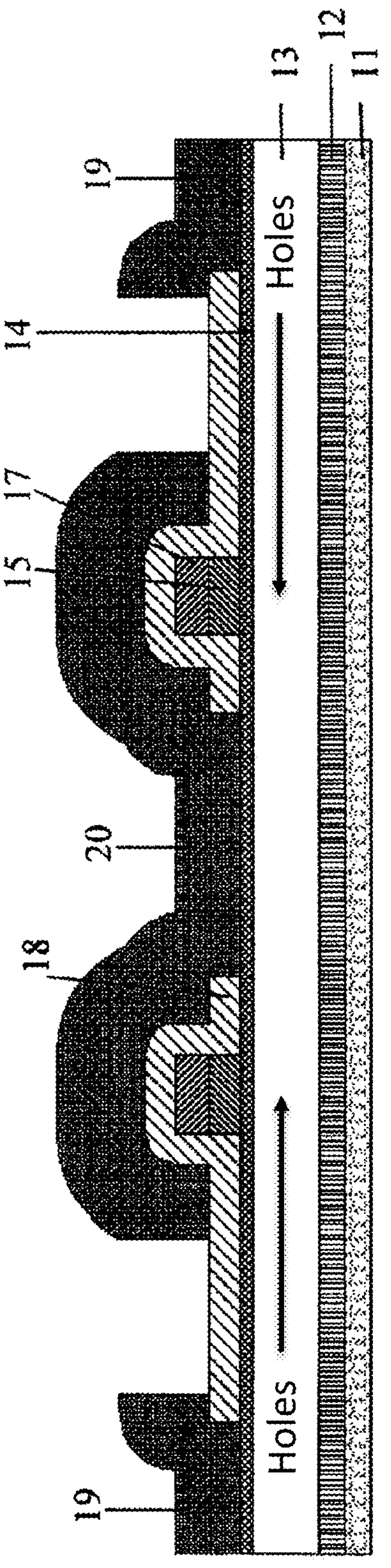
FIG. 1 PRIOR ART
FIG. 1 illustrates a cross-sectional view of a prior art enhancement mode GaN transistor.
Figure 2:
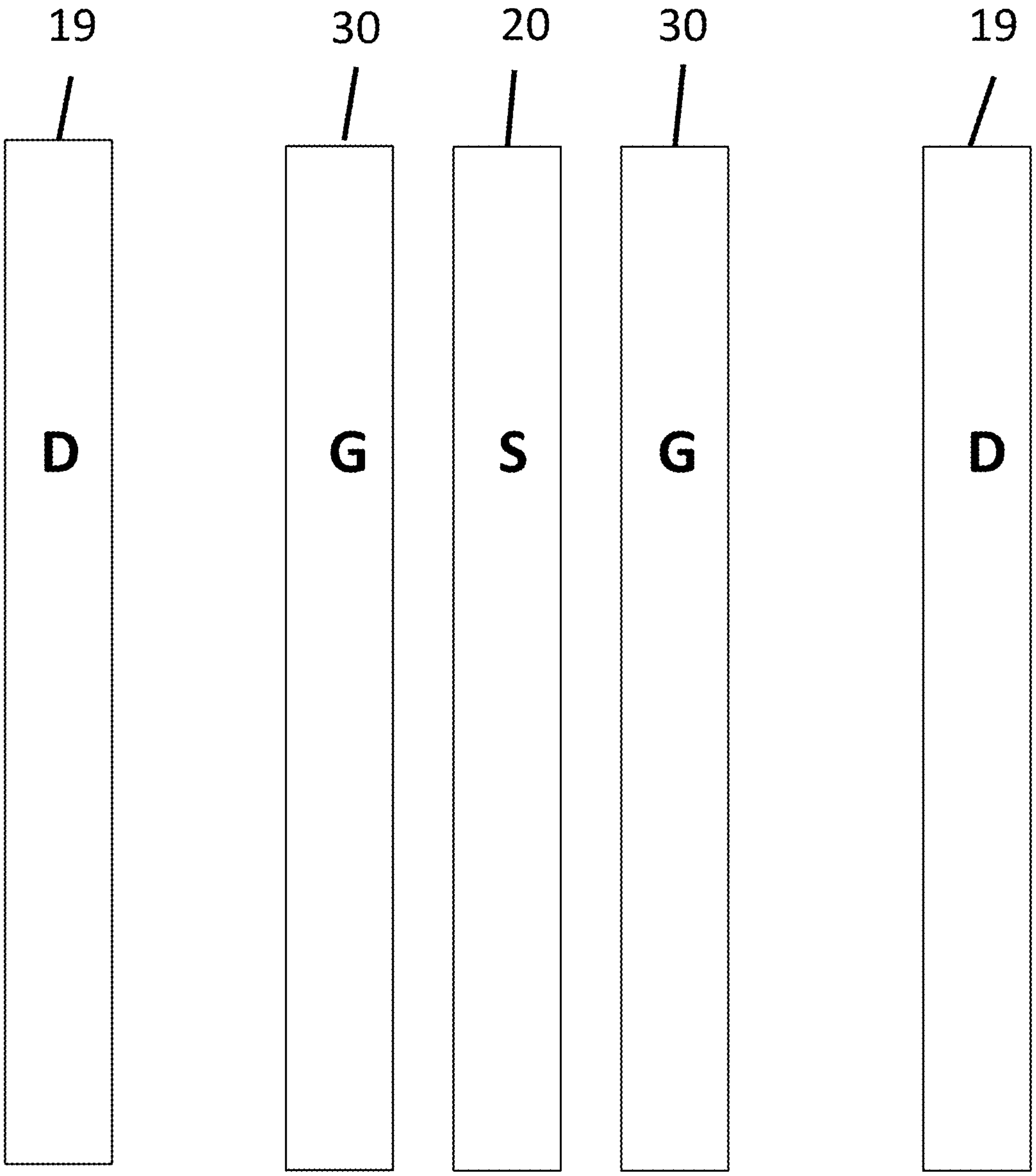
FIG. 2 PRIOR ART
FIG. 2 is a top view of the prior art GaN device of FIG. 1.

FIG. 2 is a top view of the prior art GaN device of FIG. 1, showing the gate metal 30 disposed between the ohmic contacts 19, 20 for the drain (D) and source (S), respectively. The gate metal 30 is disposed completely over the p-type GaN gate material, which is therefore not visible in the top view of FIG. 2.

Figure 3:
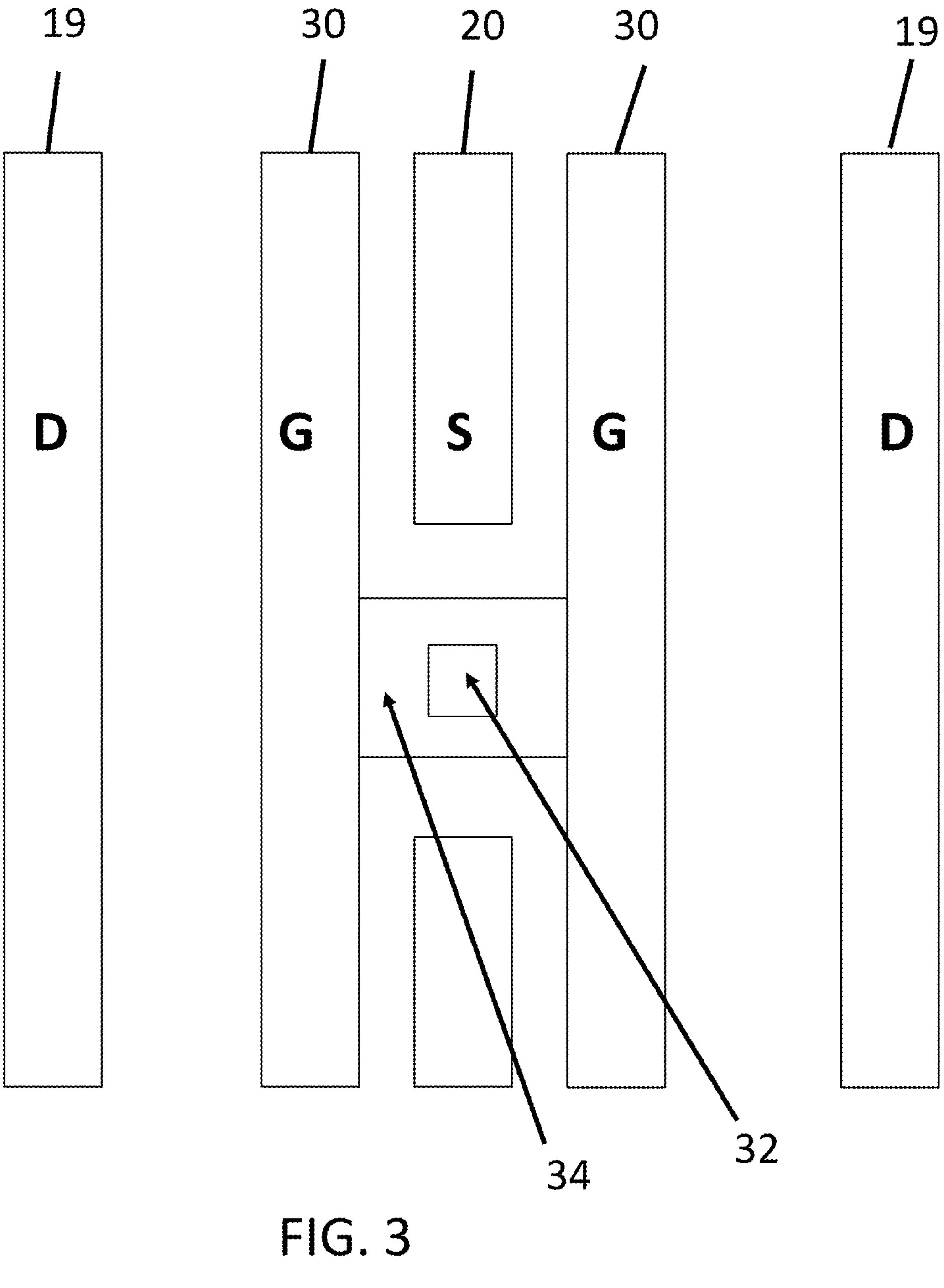
FIG. 3 shows a top view of a first embodiment of the GaN device of the present invention.

FIG. 3 shows a top view of a first embodiment of the GaN device of the present invention with a feature—a hole collector metal contact—for eliminating holes accumulating under the gate metal. In the preferred embodiment of the present invention, the holes are eliminated by recombining them with electrons. As disclosed in more detail below, the electrons are sourced from a negative voltage generating circuit and injected into the p-type gate material of the enhancement mode GaN device.

As shown in the central portion of the top view of FIG. 3, the p-type GaN gate material is formed of three sections: (1) a section in which the gate metal 30 is disposed over the p-type GaN gate material of the gate lines; (2) a section in which a hole collector electrode 32 contacts the p-type GaN gate material, as disclosed in further detail below with respect to FIGS. 7A-7D; and (3) a section 34, in which the p-type GaN gate material has no metal over it; i.e., a space 34 exists between the gate metal 30 and the hole collector metal 32.

The p-type GaN gate material below the contact metal of section 32 may be thinner than the p-type GaN gate material of the gate lines 30 (as in the recessed embodiment shown in FIG. 7B). Likewise, the bridging section 34 of p-type GaN gate material can either have the same thickness as the p-type GaN gate material of the gate lines 30, or can be thinner than the gate lines.

Figure 4A:
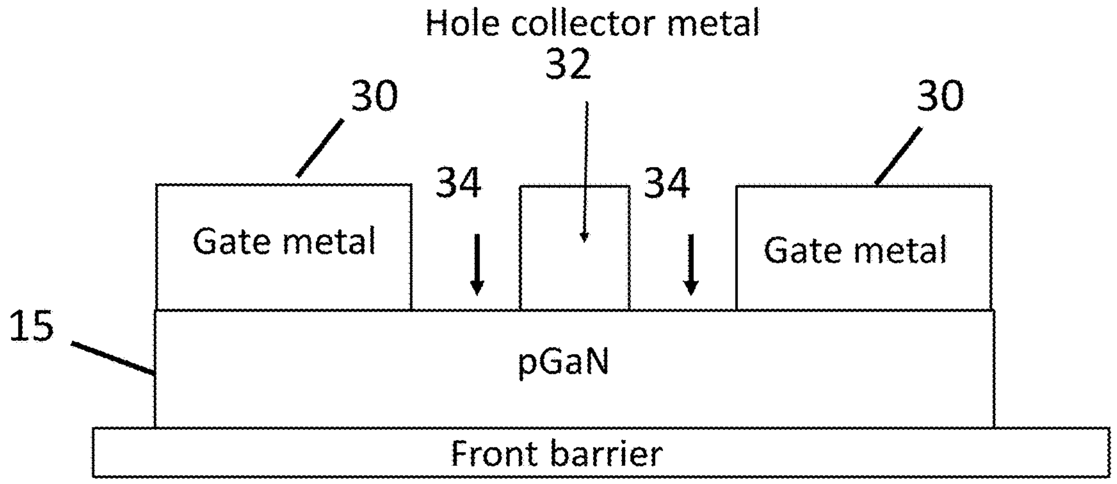
FIGS. 4A and 4B show a cross-section and top view, respectively, of the first embodiment of the present invention.
Figure 4B:
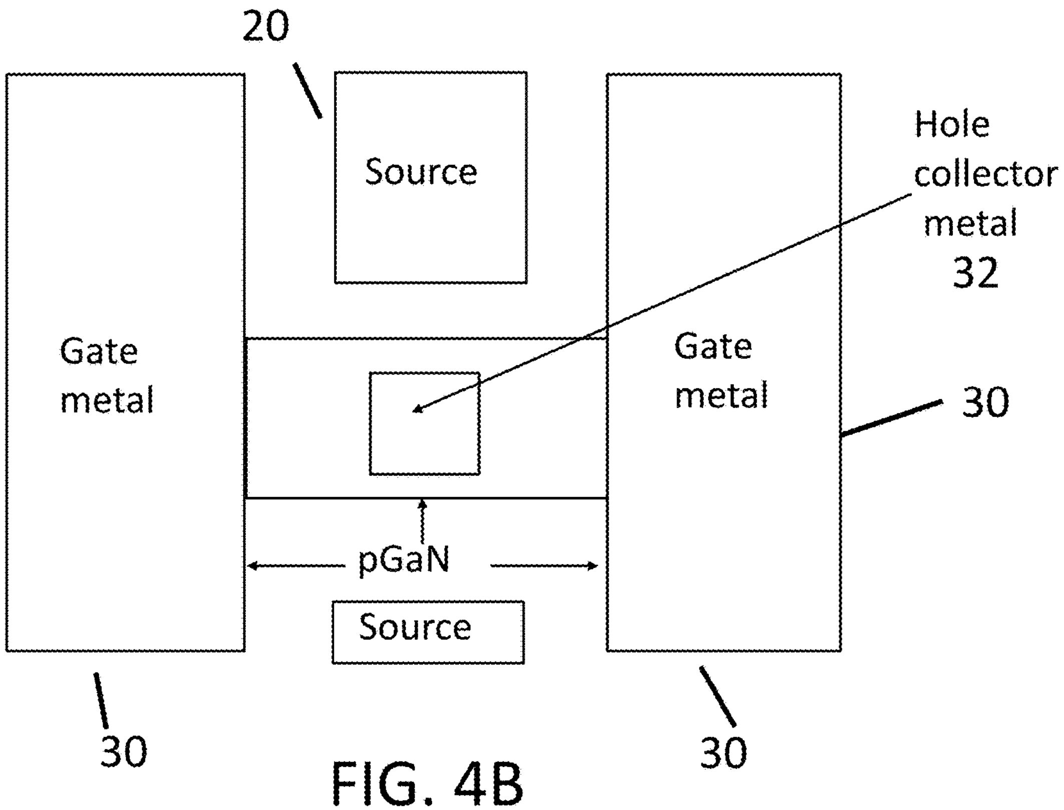

A cross-sectional view of the first embodiment of the present invention is shown in FIG. 4A. The gate metal 30 is preferably TiN. The hole collector metal 32 may be formed of the same metal as the gate metal 30, or may be formed of a different metal. The contact of the hole collector metal 32 to the p-type GaN gate material 15 preferably has a lower barrier height than the gate metal contact to the p-type GaN gate material 15, and serves as a preferential site to attract holes and, in the preferred embodiment, mutualize the holes with electrons.

There are several mechanisms by which holes can be removed from the gate:

1. Direct injection using an ohmic contact metal to the p-type GaN.
2. Tunneling through a Schottky contact.
3. Surface and sidewall recombination.
4. Thermionic emission over a Schottky contact, preferably assisted by a negative voltage applied to the metal.

Figure 5:
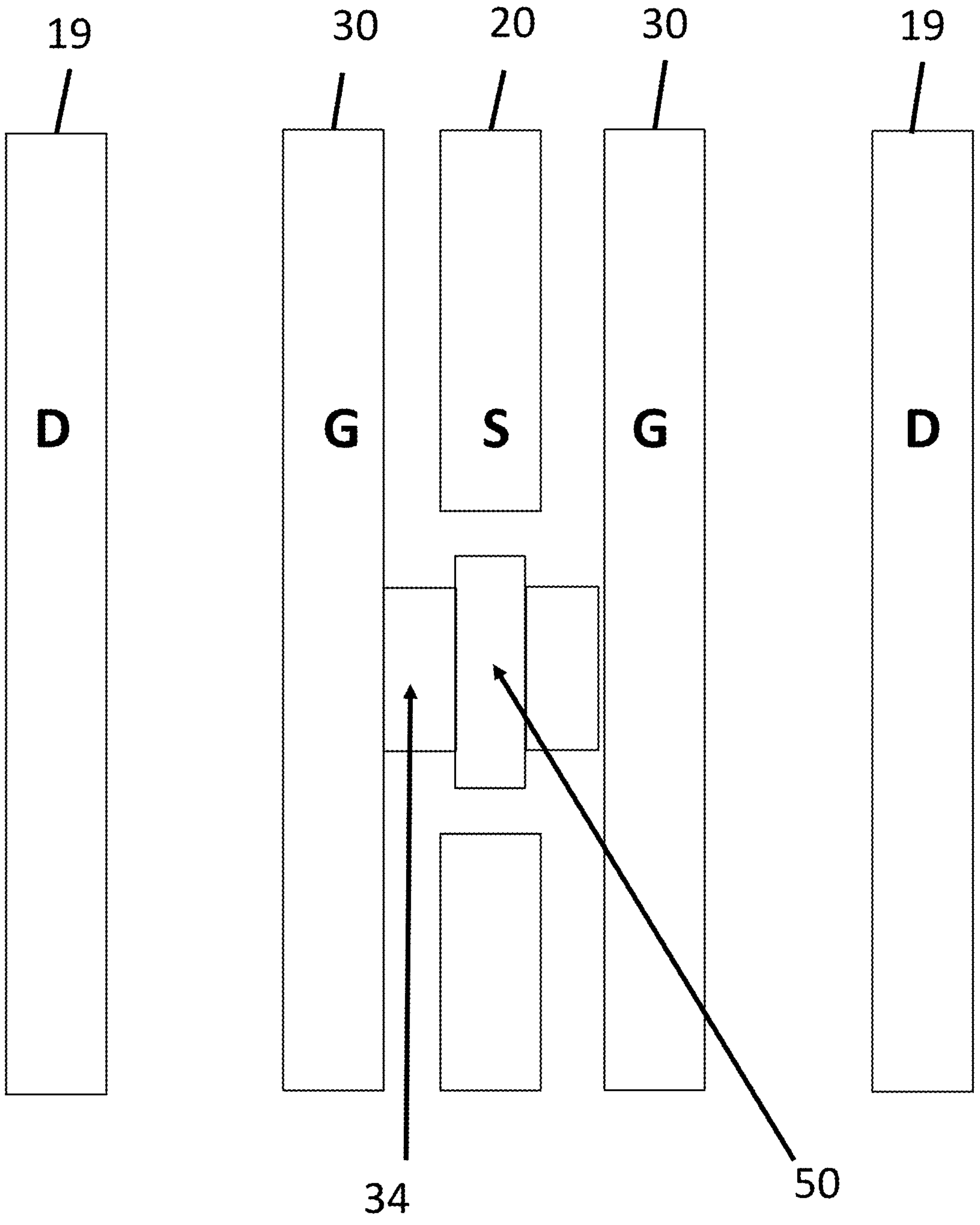
FIG. 5 shows a modification of the embodiment of FIGS. 3 and 4A/4B in which the contact metal contacts the p-type GaN gate material on the top and on the p-GaN sidewalls.

FIG. 5 shows a modification of the embodiment of FIGS. 3 and 4A/4B in which the hole collector metal 50 contacts the p-type GaN gate material on the top and on the p-GaN sidewalls, in accordance with hole removal mechanism 3 above. Contacting the sidewalls in addition to the top surface of the p-GaN facilitates the recombination of holes and electrons by increasing the contact surface area and providing a connection of lower resistance (lower barrier height) for the application of a negative hole collecting voltage.

Figure 6:
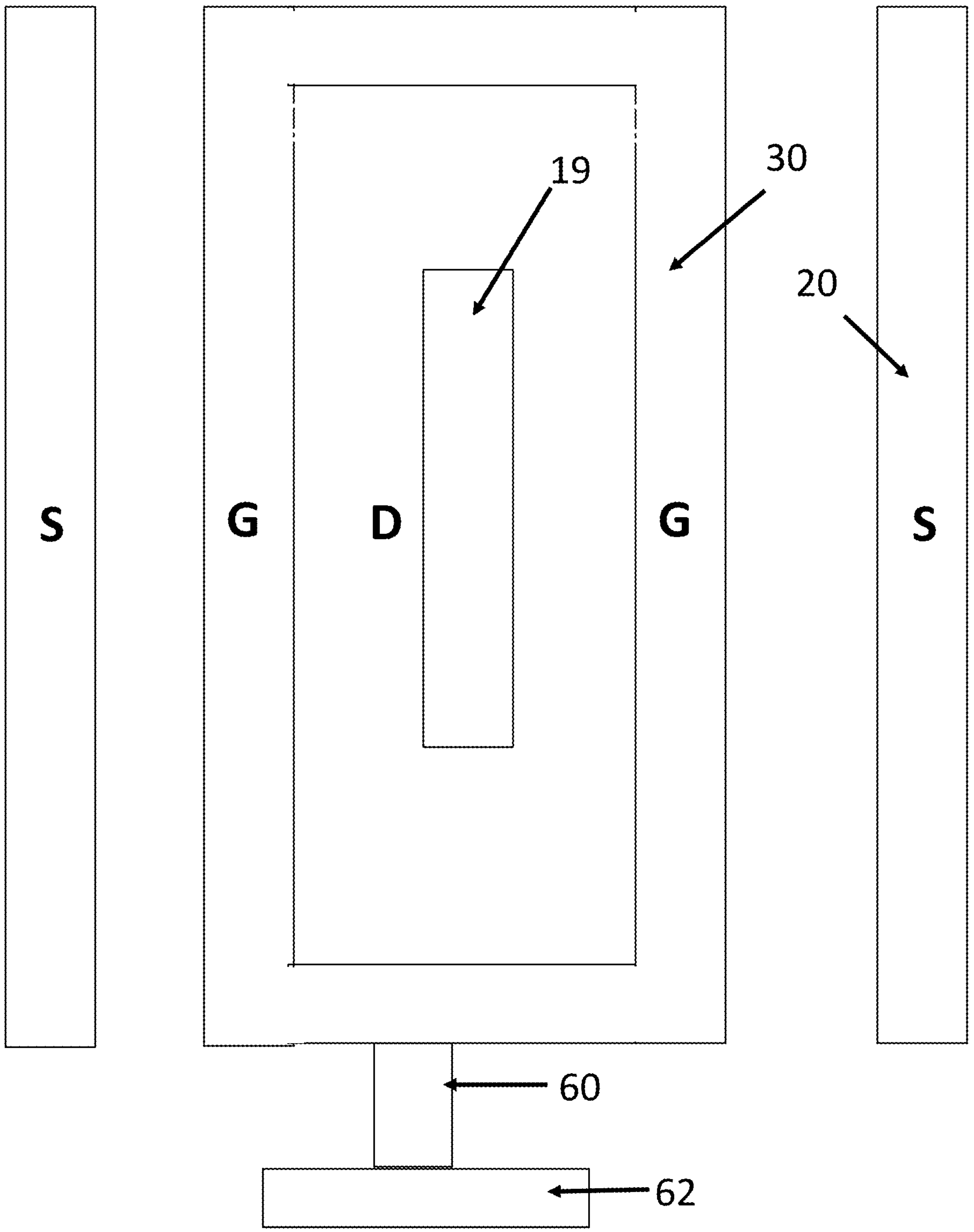
FIG. 6 shown an alternative layout in which the gate line forms a racetrack surrounding the drain contact.

FIG. 6 shown an alternative layout in which the gate line 30 forms a racetrack surrounding the drain contact 19. In this embodiment, the p-type GaN with no overlying metal contact (reference number 60), and the metal 62 making contact to the p-type GaN, are both disposed outside of the racetrack.

Figure 7A:
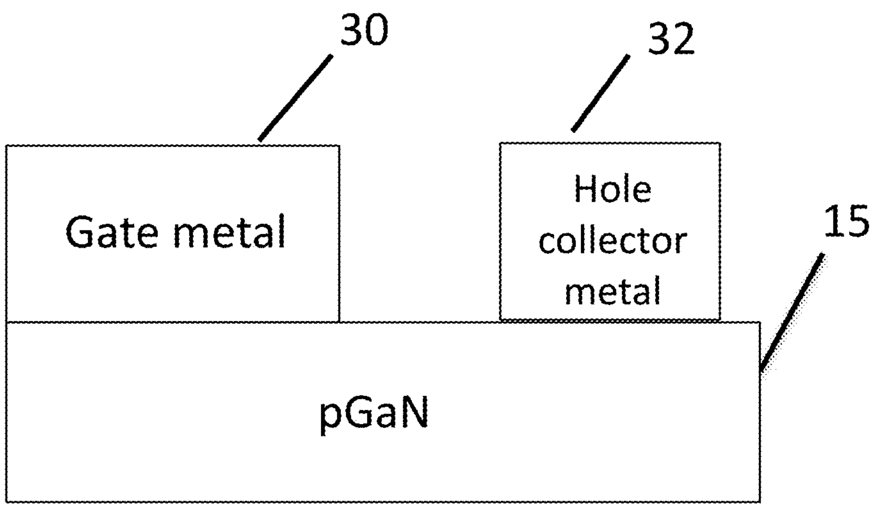
FIGS. 7A-7D show various possible connections of the hole collector metal to the p-type GaN.
Figure 7B:
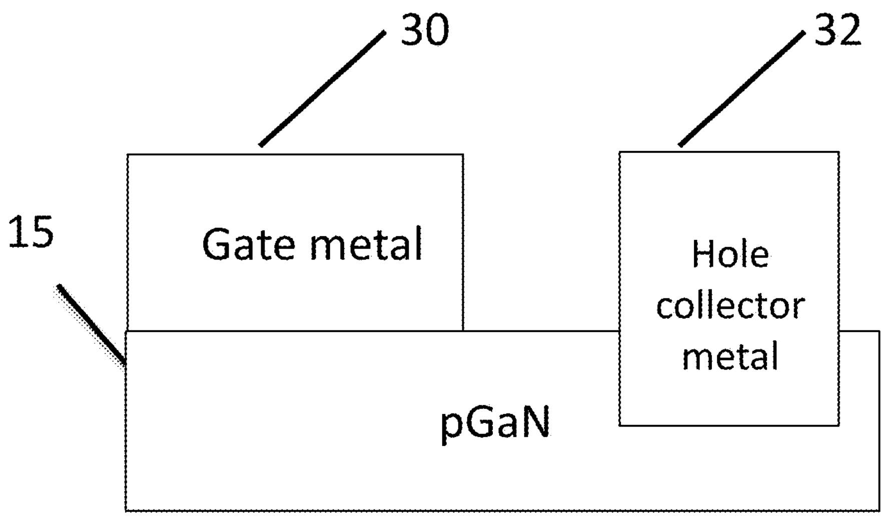
Figure 7C:
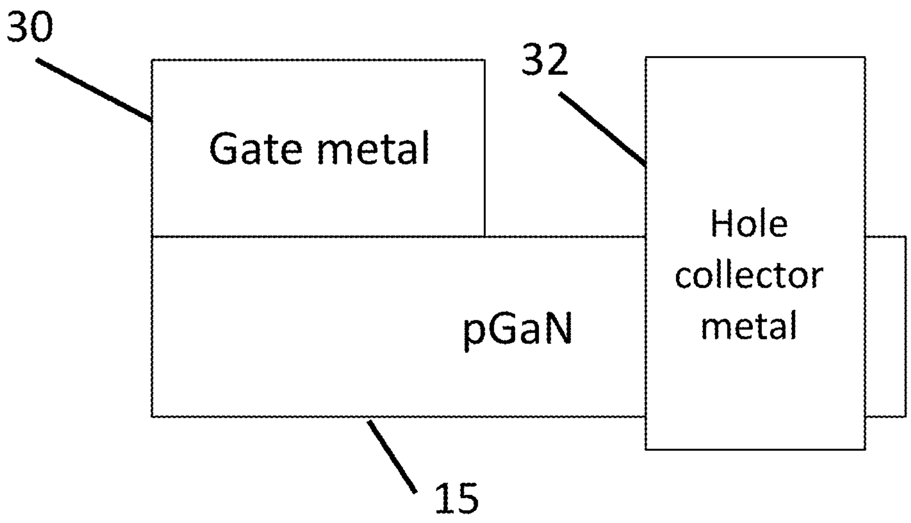
Figure 7D:
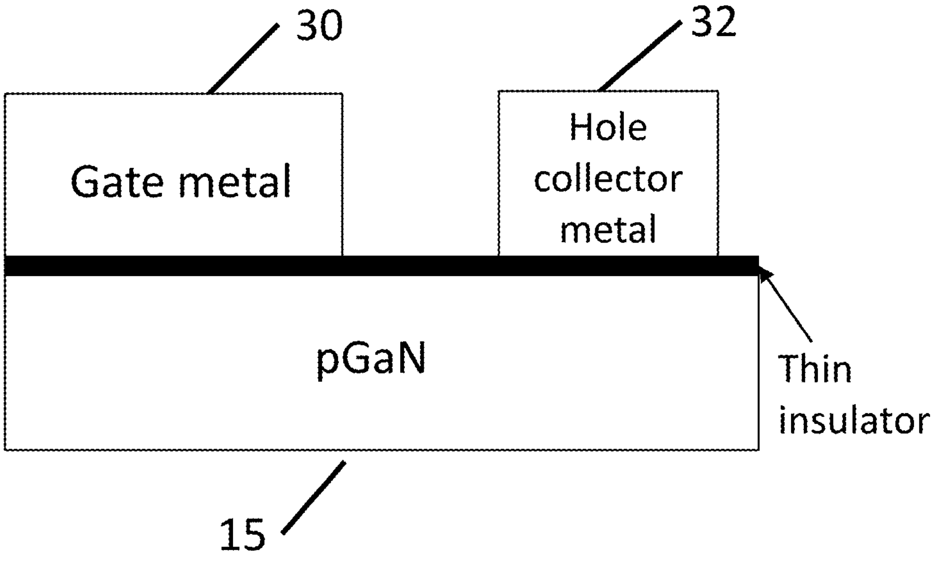

FIGS. 7A-7D show various possible connections of the hole collector metal 32 to the p-type GaN 15. FIG. 7A shows an embodiment in which the hole collector metal contacts the top surface of p-type GaN gate material 15. FIG. 7B shows an embodiment in which the hole collector metal extends into a recess in the pGaN 15. FIG. 7C shows an embodiment in which the hole collector metal extends completely through the pGaN 15. FIG. 7D shows an embodiment in which a thin insulator 70, such as $Si_3N_4$, AlN or $Al_2O_3$, is disposed between the metal contacts 30, 32 and the pGaN 15. In this embodiment, the holes, which are mobile, tunnel from pGaN 15 through the insulator 70 to the hole collector metal 32. A fifth embodiment, not shown, is a combination of the embodiments of FIGS. 7B and 7D, in which the hole collector metal extends through insulator 70 into a recess in the pGaN 15.

In accordance with the present invention, the hole collector metal 32 may be connected to the source 20 of the GaN device. More preferably, and for improved hole elimination, the hole collector metal 32 is connected to a negative voltage. The negative voltage may be provided externally through an I/O terminal, or more preferably internally, through an integrated GaN circuit that generates a negative voltage.

A preferred embodiment of an internal negative voltage generating circuit (FIG. 11) will now be described. The circuit is implemented entirely in GaN so that it can be integrated with the GaN transistor, and uses a charge pump (FIG. 10) to generate the negative voltage. The circuit generates a negative voltage in the range of −2V to −14V with an extremely low current consumption of less than 10 μA.

Figure 8:
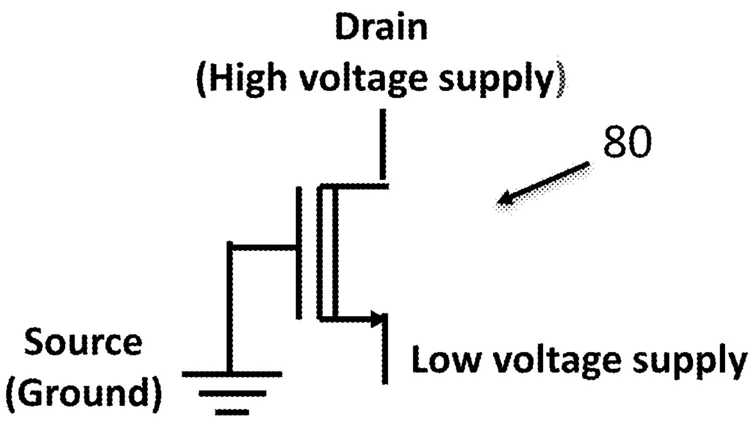
FIG. 8 shows a depletion mode GaN FET configured as a linear supply in the negative voltage generating circuit of the present invention.

The internal voltage generating circuit uses a depletion mode GaN FET 80 as a linear supply. As shown in FIG. 8, an enhancement mode GaN FET is modified to a depletion mode GaN FET. By connecting the gate to ground and applying a voltage greater than the absolute value of the threshold voltage Vth on the drain of GaN FET 80, the source of GaN FET 80 will generate a supply voltage equal to approximately the absolute value of the threshold voltage of GaN FET 80, which is 14V. Thus, the source will generate a supply voltage of approximately −14V.

Figure 9:
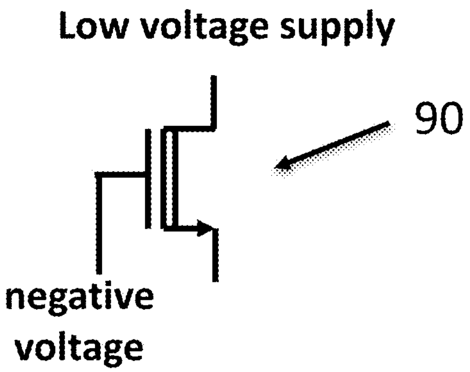
FIG. 9 shows a depletion mode GaN FET in the sensor circuitry of the voltage generating circuit.

In order to reduce the total current that the circuit can sink from the supply to 10 μA, circuitry is included to sense the negative voltage and activate the charge pump only when it is needed. As shown in FIG. 9, the sensor circuitry includes a depletion mode GaN FET 90 with its gate connected to the negative output of the voltage generating circuit of FIG. 9 (see FIG. 11). GaN FET 90 of FIG. 9 acts as an up-level shifter. The voltage at the source of GaN FET 90 is equal to negative output of the voltage generating circuit plus the absolute value of the threshold voltage (approximately 14V). As explained below with respect to the complete circuit of FIG. 11, if the negative output of the voltage generating circuit plus 14V minus Voffset multiplied by the factor R1/(R1+R2) is greater than the threshold voltage of inverter 120, then the charge pump (FIG. 10) is activated.

Figure 10:
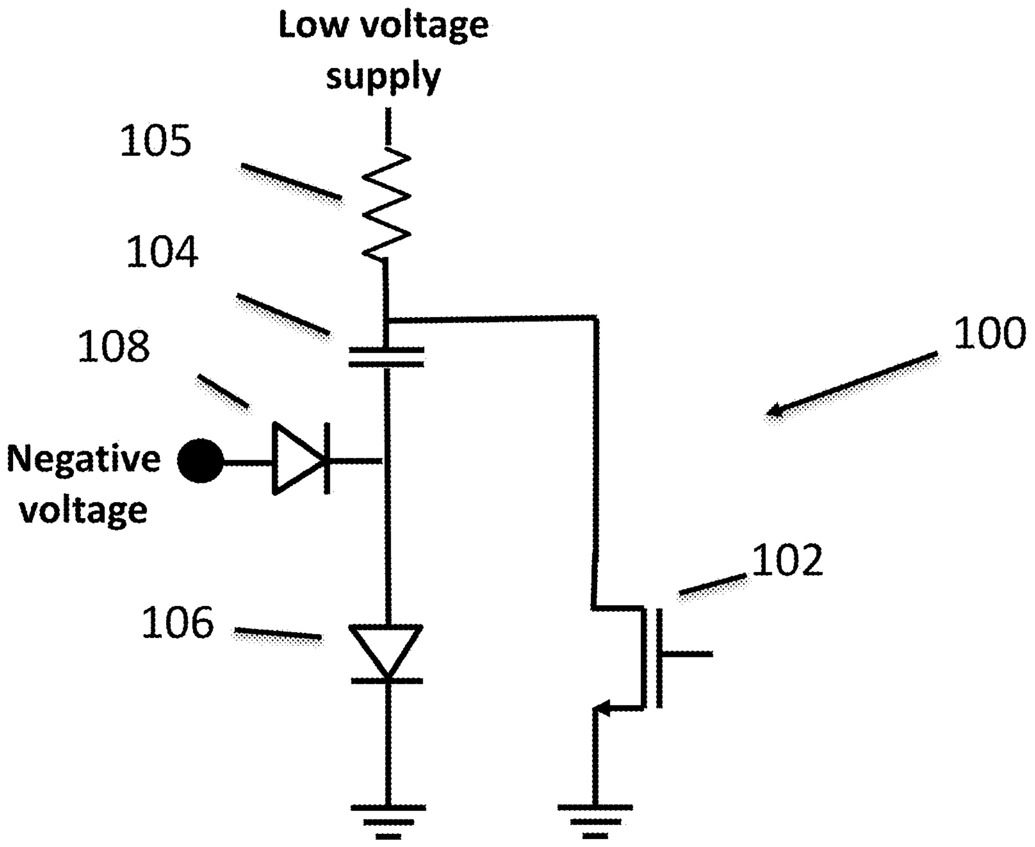
FIG. 10 is a circuit schematic of the charge pump circuitry of the negative voltage generating circuit.

The operation of the charge pump circuit 100, shown in FIG. 10, is as follows: In steady state, the charge pump enhancement mode GaN FET 102 is OFF, the upper plate of the charge pump capacitor 104 is charged to the low voltage (LV) supply by resistor 105, and the lower plate of charge pump capacitor 100 is close to ground due to diode 106. The charge pump is activated by turning on GaN FET 102. Once GaN FET 102 is conducting, the upper plate of capacitor 104 is pulled down to ground and the lower plate of capacitor 104 is pulled below ground. At this point, diode 106 is turned on and the negative output of the voltage generating circuit is also pulled below ground. Diodes 106 and 108 in the circuit of FIG. 10 can be pn junction diodes, Schottky diodes or diode connected GaN FETs.

Figure 11:
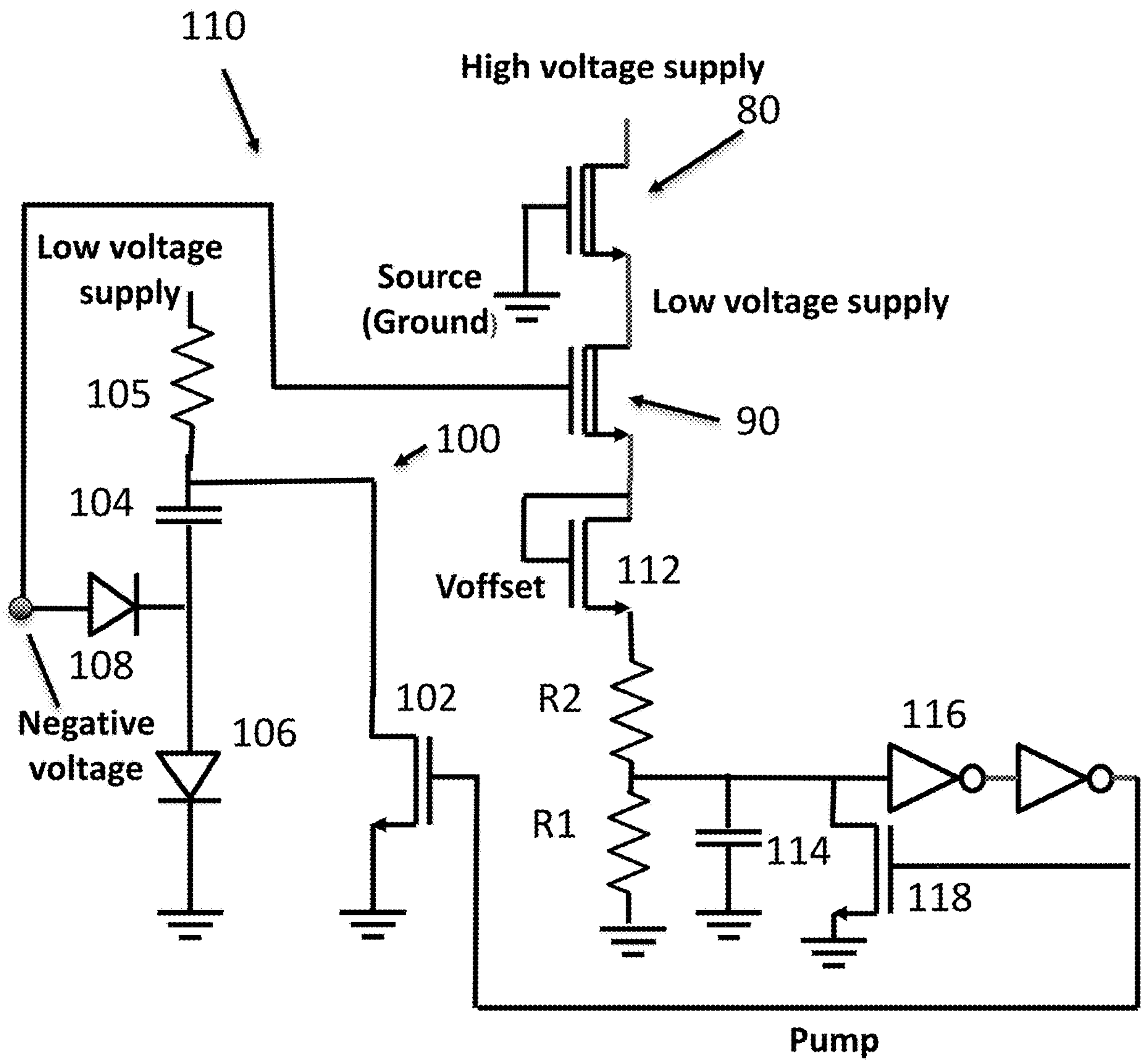
FIG. 11 is a circuit schematic of the entire negative voltage generating circuit.

The operation of the sensing circuit is now described with reference to FIG. 11, which shows the complete negative voltage generating circuit 110. Depletion mode FET 80 generates the low voltage supply for the circuit. Depletion mode FET 90 senses the negative voltage generated by charge pump circuit 100. The source of FET 90 is approximately 14V higher compared to the gate. The source voltage can be lowered by a voltage offset (Voffset) via gate-to-drain connected FET 112 to reduce current consumption and charges a capacitor 114 through a voltage divider formed of resistors R1 and R2.

Once the voltage on capacitor 114

$$\left(\text{negative voltage} + \left|V_{Th}^{Dep}\right| - V\mathit{offset}\right)\frac{R1}{R1+R2}$$

reaches the threshold of inverter 116, the charge pump 100 is activated. The Pump signal triggers the charge pump circuit 100. The Pump signal also resets capacitor 114 through FET 118.

The above description and drawings are only to be considered illustrative of specific embodiments, which achieve the features and advantages described herein. Accordingly, the embodiments of the invention are not considered as being limited by the foregoing description and drawings.

More generally, even though the present disclosure and exemplary embodiments are described above with reference to the examples according to the accompanying drawings, it is to be understood that they are not restricted thereto. Rather, it is apparent to those skilled in the art that the disclosed embodiments can be modified in many ways without departing from the scope of the disclosure herein. Moreover, the terms and descriptions used herein are set forth by way of illustration only and are not meant as limitations. Those skilled in the art will recognize that many variations are possible within the spirit and scope of the disclosure as defined in the following claims, and their equivalents, in which all terms are to be understood in their broadest possible sense unless otherwise indicated.

What is claimed is:

1. An enhancement mode gallium nitride (GaN) transistor, comprising:

a source, a gate and a drain, wherein the gate comprises a p-type GaN material disposed over a front barrier layer and a gate electrode disposed over a portion of the p-type GaN material, and a hole collector electrode, wherein the gate electrode and the hole collector electrode are disposed over and contact respective portions of the top surface of the p-type GaN material, such that the p-type GaN material serves as both p-type GaN gate material under the gate electrode and as a continuous p-type GaN material bridge from the p-type GaN gate material directly to the hole collector electrode, wherein the hole collector electrode is laterally spaced from the gate electrode on the top surface of the p-type GaN material, and wherein, when a negative voltage is applied to the hole collector electrode, holes accumulating in the p-type GaN gate material are removed.

2. The enhancement mode GaN transistor of claim 1, wherein the hole collector electrode is laterally spaced from the gate electrode on the top surface of the p-type GaN material.

3. The enhancement mode GaN transistor of claim 2, wherein the hole collector electrode extends into a recess in the p-type GaN material.

4. The enhancement mode GaN transistor of claim 2, wherein the hole collector electrode extends completely through the p-type GaN material.

5. The enhancement mode GaN transistor of claim 1, wherein the hole collector electrode is electrically connected to a negative voltage generating circuit.

6. The enhancement mode GaN transistor of claim 5, wherein the negative voltage generating circuit is formed in GaN and is integrated with the transistor.

7. The enhancement mode GaN transistor of claim 6, wherein the negative voltage generating circuit comprises a charge pump to generate the negative voltage.

8. The enhancement mode GaN transistor of claim 7, wherein the negative voltage generating circuit comprises circuitry for sensing the negative voltage and activating the charge pump when needed.

9. The enhancement mode GaN transistor of claim 1, wherein the negative voltage is provided externally through an I/O terminal.

* * * * *